(12) United States Patent
Lesso

(10) Patent No.: US 11,031,940 B2
(45) Date of Patent: Jun. 8, 2021

(54) SENSING CIRCUITS

(71) Applicant: Cirrus Logic International Semiconductor Ltd., Edinburgh (GB)

(72) Inventor: John Paul Lesso, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 16/225,821

(22) Filed: Dec. 19, 2018

(65) Prior Publication Data

US 2019/0199359 A1  Jun. 27, 2019

Related U.S. Application Data

(60) Provisional application No. 62/609,041, filed on Dec. 21, 2017.

(51) Int. Cl.
| | |
|---|---|
| *H03L 7/087* | (2006.01) |
| *H03L 7/099* | (2006.01) |
| *H03L 7/18* | (2006.01) |
| *H03L 7/10* | (2006.01) |
| *H03K 3/0231* | (2006.01) |
| *H03L 7/085* | (2006.01) |

(52) U.S. Cl.
CPC .......... *H03L 7/087* (2013.01); *H03K 3/0231* (2013.01); *H03L 7/085* (2013.01); *H03L 7/099* (2013.01); *H03L 7/10* (2013.01); *H03L 7/18* (2013.01)

(58) Field of Classification Search
CPC ........... G06F 3/044; G06F 2203/04104; H03L 7/087; H03L 7/099; H03L 7/10; H03L 7/18

See application file for complete search history.

(56) References Cited

U.S. PATENT DOCUMENTS

| | | | |
|---|---|---|---|
| 2013/0027087 A1* | 1/2013 | Latal ................ | H02M 3/156 327/63 |
| 2015/0326123 A1* | 11/2015 | Fukushima ........ | H02M 3/158 323/271 |
| 2017/0242534 A1* | 8/2017 | Gray ................. | G06F 3/044 |

* cited by examiner

*Primary Examiner* — Sung S Ahn
(74) *Attorney, Agent, or Firm* — Jackson Walker L.L.P.

(57) ABSTRACT

This application relates to sensing circuits for sensing a physical property or quantity of interest. The sensing circuit has an oscillator comprising a hysteretic comparator and a loop filter configured to output an oscillation signal. The loop filter comprises a first component with an electrical property that varies with the physical property or quantity of interest. A time constant of the loop filter depends on the electrical property of the first component. A decoder is configured to receive the oscillation signal and provide an indication of any change in frequency of the oscillation signal as an indication of a change in the physical property or quantity of interest. The electrical property may be an impedance, such as a resistance.

20 Claims, 4 Drawing Sheets

SENSING CIRCUITS

FIELD

The field of representative embodiments of this disclosure relates to methods, apparatus and/or implementations concerning or relating to sensing circuits.

BACKGROUND

Electrical sensing circuits are known and used in a number of different applications. Generally an electrical sensing circuit is arranged so that an electrical property monitored by the sensing circuit, such as an impedance for example, varies with a physical property or physical quantity which it is wished to monitor. For instance it may be wished to produce an electrical signal in response to a stimulus acting on a transducer, e.g. an applied strain, force or pressure for example. The sensing circuit is thus arranged so that an electrical property of the circuit varies with, or as a result of, the applied stimulus in a way that can be measured. Some sensing circuits may provide an electrical signal based on the physical state of a monitored system, e.g. based on the position, location or displacement of one or more component of the system, where an electrical property monitored by the sensing circuit depends on the relative position of said component(s), for example position sensing of a coil of a loudspeaker or linear resonant actuator, e.g. for over-excursion protection or distortion control.

One particular application is sensing of an applied strain, force or pressure in a defined area, as part of a user interface of an electronic device. Most electronic devices comprise various means by which a user can physically interact with the device to control aspects of operation of the device, for example various control buttons or the like. Conventionally, in the case of buttons, at least some of these will be distinct physical buttons, e.g. mechanical switches or the like, formed of distinct parts which move with respect to one another.

It is also common for at least some types of electronic devices to include the ability for touch sensitivity in some areas, for instance in a display area, i.e. a touchscreen. This can allow the device to display various different virtual buttons, which may depend on context, to allow interaction with the device and/or a touchscreen can allow the user to control aspects of the device operation by making various movements on the touch sensitive area. Such an arrangement can reduce the number of physical buttons required for the device and provide a range of control options.

However providing touch sensitivity over an area generally requires a sensing matrix which, in use, can consume a relatively significant amount of power. For many devices, especially portable devices operable with battery power, the power efficiency of the device is important. Generally, therefore, touchscreens or the like are only enabled in some operational states of the device, when the device is actively being used in a mode where a touch input is likely. When not actively being operated by a user the device may enter a lower power mode, such as a sleep or standby mode, in which the touchscreen may be disabled to save power.

Typically the device may be woken from such a low power state by the user interacting with one of the physical buttons. Physical buttons can be monitored for presses in a relatively low power way and provide a clear indication when pressed.

However the use of distinct physical buttons, e.g. distinct switch based button, may be undesirable in some instances, e.g. for any of cost, durability or design/aesthetic considerations.

It would therefore be desirable in some applications to provide a device interface, that a user could interact with, which does not require a physical button with moving parts but which can be monitored separately from a touchscreen of the device, e.g. to indicate a change of state. Strain or pressure sensing may be used in such applications to sense an applied force. For example a strain sensor may be arranged with a resistive element whose resistance changes as a result of applied strain. However conventional strain or pressure sensing can require continual sensing which may consume a relatively high amount of power.

EXAMPLE EMBODIMENTS OF THE PRESENT DISCLOSURE

Embodiments of the present invention relate to methods and apparatus for sensing which can provide low power sensing with rapid and reliable detection of a sensed physical property or quantity. Some embodiments specifically relate to strain sensing, e.g. detecting an applied force or pressure for touch sensitivity.

According to some embodiments there is provided a sensing circuit for monitoring a physical property or quantity of interest comprising:

an oscillator comprising a hysteretic comparator and a loop filter configured to output an oscillation signal;

wherein the loop filter comprises a first component with an electrical property that varies with said physical property or quantity; wherein a time constant of the loop filter depends on the electrical property of the first component; and a decoder configured to receive the oscillation signal and provide an indication of any change in frequency of the oscillation signal.

In some embodiments the oscillator may comprise a timing controller for controlling at least one timing parameter of the oscillation signal.

In some instances the at least one timing parameter of the oscillation signal may comprise a timing of any transitions in the oscillation signal. The timing controller may be configured to receive a first clock signal, which is also used for controlling timing of the decoder, and to synchronise transitions in the oscillation signal to the first clock signal. The timing controller may comprise a latch arrangement which is latched by the first clock signal. The hysteretic comparator may comprise a latched hysteretic comparator which operates as the latch arrangement of the timing controller.

Additionally or alternatively in some instances the at least one timing parameter of the oscillation signal may comprise oscillation frequency limits for the oscillation signal. The timing controller may comprise a hysteresis controller for controlling a hysteresis applied by the hysteretic comparator based on an output of the decoder to maintain the frequency of the oscillation signal within defined limits. The timing controller may be configured to control the hysteresis applied based on an indication of a difference between a first value being a time-average of the oscillation frequency and a second value corresponding to a nominal count value oscillation frequency.

In some implementations the decoder may comprise a counter configured to receive a counter clock signal and to produce a count value of a number of clock cycles of the counter clock signal in each of a plurality of periods defined by the oscillation signal.

In some embodiments, where the transitions in the oscillation signal are synchronised to a first clock signal, the first clock signal may be used as the counter clock signal.

In some implementations the decoder may comprise a counter configured to receive a counter clock signal and to produce a count value of a number of cycles of the oscillation signal in each of a plurality of frame periods defined by the clock signal.

The sensing circuit may further comprise a controller configured to receive a count signal from the counter which is indicative of the count values. The controller may be configured to determine a value for the physical property or quantity of interest based on the count signal.

The at least one electrical property of the loop filter which is configured to vary may comprise an impedance of a variable impedance. The at least one electrical property of the loop filter which is configured to vary may comprise a resistance of a variable resistive component. The physical property or quantity of interest may be an applied strain and the resistance of the variable resistive component may be configured to vary with strain applied to the variable resistive component. The sensing circuit may be configured as a button press detector, and the sensing circuit may comprise a controller responsive to the indication of any change in frequency of the oscillation signal to detect an applied strain above a threshold level being applied to a defined button area of a device.

In some embodiments an electrical property of the loop filter which is configured to vary may comprise a capacitance of a variable capacitive component. The physical property or quantity of interest may comprise position of a coil of an acoustic transducer and the capacitance of the variable capacitive component is configured to vary with position of the coil.

In some embodiments an electrical property of the loop filter which is configured to vary may comprise an inductance of a variable inductive component.

In some examples the variable inductive component may comprises a conductive coil configured with respect to a conductive plate, such that at least part of the conductor plate may be displaced with respect to the conductive coil so as to vary an observed impedance of the variable inductive component. In some embodiments the conductive plate may comprise a metal plate. The conductive plate may be coupled to, or form at least part, of a button or a defined button area, which may be a control button of a host device. In some implementations the coil may be a conductive pattern or trace formed on or within a substrate, for example a printed circuit board.

The sensing circuit may be configured as a button press detector. The conductor plate and coil may be located in a defined button area of a device and the sensing circuit may comprise a controller responsive to the indication of any change in frequency of the oscillation signal to detect a displacement of the conductor plate with respect to the conductive coil above a threshold level.

The loop filter may comprise a resistive-capacitive filter configured to filter a feedback path between an output of the hysteretic comparator and an input of the hysteretic comparator.

The loop filter may comprise an integrator.

The sensing circuit may be implemented as an integrated circuit.

Embodiments also relate to a transducer apparatus comprising a transducer and a sensing circuit, according to any of the variants described herein, for monitoring a transducer parameter of said transducer.

Embodiments also relate to an electronic device comprising a sensing circuit according to any of the variants described herein, or a transducer apparatus as discussed above. The electronic device may be at least one of: a portable device; a battery powered device; a communication device; a mobile or cellular telephone; a smartphone; a computing device; a notebook, laptop or tablet computing device; a gaming device; a wearable device; a smartwatch; a voice controlled or voice activated device; a personal media player; an appliance.

In another aspect there is provided a sensing circuit comprising:
  an oscillator comprising a hysteretic comparator and a loop filter configured to output an oscillation signal;
  wherein the loop filter comprise a first component with an impedance that varies in response to an external stimulus, wherein a time constant of the loop filter depends on the electrical property of the first component; and
  a decoder configured to receive the oscillation signal and provide an indication of frequency of the oscillation signal.

The first component may be a resistive component with a resistance that varies with applied strain. The first component may be a capacitive component with a capacitance that varies with position of a coil of an acoustic transducer.

In another aspect there is provided a sensor for sensing a physical property or quantity of interest comprising:
  an oscillator comprising a hysteretic comparator and a loop filter configured to output an oscillation signal;
  wherein the loop filter comprise a first component with an electrical property that varies with said physical property or quantity of interest, wherein a time constant of the loop filter depends on the electrical property of the first component; and
  a decoder configured to receive the oscillation signal and a first clock signal and provide a count value as an indication of a frequency of the oscillation signal;
  wherein the oscillator comprises a timing controller for controlling at least one timing parameter of the oscillation signal based on the first clock signal and/or the indication of the frequency of the oscillation signal.

In another aspect there is provided a sensing circuit comprising: a hysteretic comparator for outputting an oscillation signal; a loop filter arranged as part of a feedback loop between an output of the hysteretic comparator and an input of hysteretic comparator; wherein the loop filter comprise a first component with an electrical property that varies in a predetermined way with physical property or quantity of interest, wherein a time constant of the loop filter depends on the electrical property of the first component.

In another aspect there is provided a sensing circuit for sensing a response to an external stimulus comprising: an oscillator comprising a hysteretic comparator and a loop filter configured to output an oscillation signal; a decoder configured to receive the oscillation signal and provide an indication of the frequency of the oscillation signal; and wherein a time constant of the loop filter varies in response to the stimulus.

In another aspect there is provided a sensing circuit comprising:
  an oscillator comprising a hysteretic comparator and a loop filter configured to output an oscillation signal;

wherein the loop filter comprises a conductive coil spaced apart from a conductive plate such that an observed impedance of the conductive coil varies with a distance between the conductive coil and the conductive plate and wherein a time constant of the loop filter depends on the observed impedance of the conductive coil; and a decoder configured to receive the oscillation signal and provide an indication of a frequency of the oscillation signal.

In another aspect there is provided a displacement sensing circuit comprising:

an oscillator comprising a comparator and a loop filter configured to output an oscillation signal;

wherein the loop filter comprise conductive coil spaced apart from a conductive plate such that at least part of the conductive plate can be displaced with respect to the conductive coil and so as to vary a time constant of the loop filter;

a decoder configured to receive the oscillation signal and provide an indication of frequency of the oscillation signal.

The displacement sensor may be coupled as a button press detector to detect displacement of a button beyond a threshold.

BRIEF DESCRIPTION OF THE DRAWINGS

For a better understanding of examples of the present disclosure, and to show more clearly how the examples may be carried into effect, reference will now be made, by way of example only, to the following drawings in which.

DETAILED DESCRIPTION

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

Embodiments of the present disclosure relate to sensing, and to sensing of physical properties or quantities, such as applied strain or position of a coil of an acoustic transducer such as a microphone, loudspeaker or linear resonant actuator (LRA).

As mentioned above for some devices it may be desirable to implement a control interface that can be monitored for user input, e.g. to provide a button press detection capability, that does not require a physical button with distinct moving parts and/or which can be monitored using relatively low power and simple monitoring circuitry.

One approach is to provide a similar functionality to a conventional mechanical button via a strain transducer arrangement in a defined location. A user pressing in the defined location would lead to a detectable strain in the strain transducer, which can be taken as a button press. Conveniently, when combined with some haptic feedback, this can provide the user with a similar user experience as a mechanical button.

Strain transducers based on a resistive Wheatstone bridge type arrangement are known. In such an arrangement two bridge branches, each comprising at least two resistive elements, are biased, in use, between two bias voltages, say $V_{BIAS}$ and ground. Sensing is achieved by monitoring the differential voltage across the midpoint of the two arms, e.g. using a differential amplifier and analogue-to-digital converter (ADC). Force applied to the transducer causes a change in resistance of at least one of the resistive elements, resulting in a detectable change in voltage, related to the strain applied.

Such an arrangement can provide reliable force or pressure sensing, but such an arrangement may not be suitable for low power monitoring for a control input in a battery powered device.

Some embodiments of the present disclosure relate to improved strain sensing, e.g. for detecting applied force or pressure.

Figure 1:
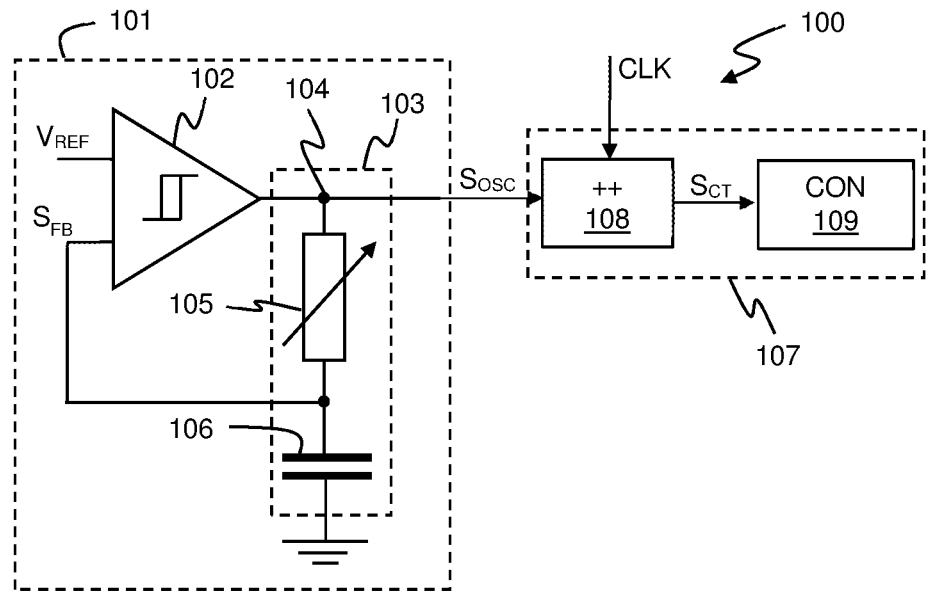
FIG. 1 illustrates a sensing circuit according to an embodiment.

FIG. 1 illustrates an example of a sensor 100 for sensing a physical property or quantity, which may be strain, according to one embodiment. An oscillator 101 comprises a comparator, in this example a hysteretic comparator 102, which is arranged to generate an oscillation signal $S_{OSC}$ and which is configured to receive a feedback signal $S_{FB}$, that corresponds to a version of the oscillation signal $S_{OSC}$ which is tapped at an output node 104. The oscillator also has a loop filter 103 arranged to provide filtering as part of a feedback loop. In the oscillator 101 of FIG. 1, the loop filter 103 is arranged to apply filtering in a feedback path between the output node 104 and an input to the hysteretic comparator 102. The hysteretic comparator 102 compares the feedback signal $S_{FB}$ to threshold levels defined by the amount of hysteresis of the hysteretic comparator 102. In some embodiments the threshold levels may also be defined with respect to a reference voltage $V_{REF}$ received at a second input of the hysteretic comparator 102.

In the arrangement shown in FIG. 1 the hysteretic comparator 102 will output either of two output states at different voltages, e.g. high and low voltages $V_H$ and $V_L$. The voltage reference $V_{REF}$ may be a voltage somewhere in the range between $V_H$ and $V_L$ and typically may be a midpoint voltage. In use the hysteretic comparator 102 will operate to output one of the output states, which will be filtered by the filter 103 and cause the value of the feedback signal $S_{FB}$ to change. For instance when the hysteretic comparator 102 outputs the high voltage $V_H$ the value of the feedback signal $S_{FB}$ will rise over time. At some point the feedback signal $S_{FB}$ will reach the relevant threshold, say $V_{REF}+H$ where H is the amount of hysteresis applied, and the hysteretic comparator 102 will swap to the other output state, i.e. the low voltage $V_L$ in this case. The value of the feedback signal $S_{FB}$ will then start decreasing, until the relevant other threshold is reached, e.g. $V_{REF}-H$, at which point the hysteretic comparator 102 will swap back to the high output voltage $V_H$. This process will repeat and the output signal $S_{OSC}$ will thus be a cyclic oscillation signal.

One skilled in the art will appreciate that a reference voltage $V_{REF}$ may be supplied to a defined comparator input as illustrated in FIG. 1, but in some embodiments the thresholds, e.g. $V_{REF}+H$ and $V_{REF}-H$, may be defined by the structure of the comparator and there may not be a distinct second input as such, particularly if the reference voltage is ground. Likewise one skilled in the art will also appreciate that whilst the hysteresis applied may be symmetric in this way, i.e. the magnitude of the hysteresis H applied in each direction is the same, this need not be the case, for instance the thresholds could be defined as $V_{REF}+H_1$ and $V_{REF}-H_2$ where $H_1$ does not equal $H_2$. For ease of explanation the embodiments will be described with reference to symmetric hysteresis of an amount H being applied.

Where the thresholds are symmetric about a midlevel voltage, i.e. a midlevel voltage between $V_H$ and $V_L$, the output signal $S_{OSC}$ will oscillate between equal periods of the high voltage state $V_H$ and the low voltage state $V_L$ with a cycle frequency that depends on the time constant of the filter 103 and the amount of hysteresis applied. FIG. 1 illustrates that the filter 103 comprises a resistive-capacitive filter comprising resistive component 105 and capacitance 106. Such an oscillator 101 may thus be seen as a Schmitt trigger relaxation oscillator where the cycle frequency is inversely proportional to the RC time constant of the filter 103.

In some embodiments of the disclosure the resistive component 105 comprises a variable resistance. In some embodiments the variable resistance component 105 has a resistance value that varies with a transducer parameter, i.e. a physical parameter or quantity of interest, which may be applied strain.

As mentioned above, various resistive components are known that exhibit a variation in resistance when subjected to an applied strain, i.e. under applied pressure or force. Such elements may be relatively small and may be readily implemented in an electronic device to detect a force applied in a defined area of a surface of an electronic device, e.g. a defined button area.

Figure 2:
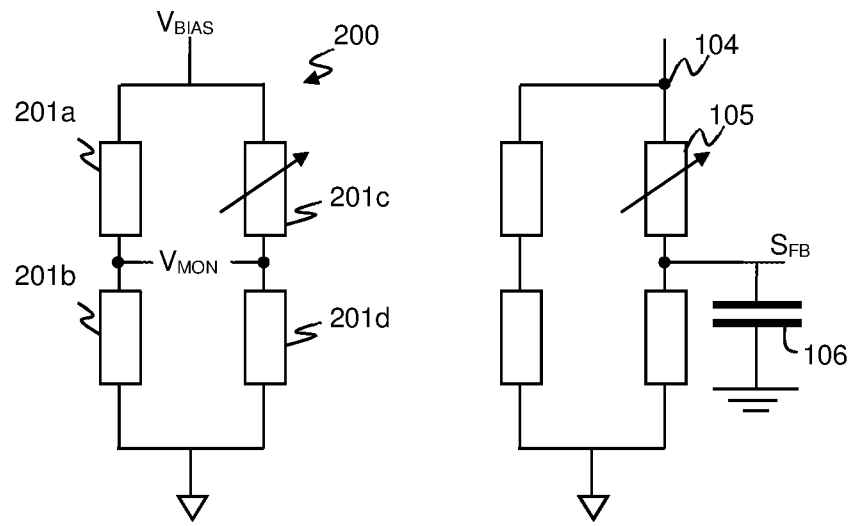
FIG. 2 illustrates examples of a variable resistance component based on a resistor bridge.

FIG. 2 illustrates the general arrangement of a known resistive bridge element 200. The resistive element comprises at least four resistive elements 201a-201d in respective arms of the bridge, at least some of which exhibit a variable resistance with applied strain. For conventional strain sensing the bridge may be arranged as illustrated on the left-hand side, with the bridge being connected between a bias voltage $V_{BIAS}$ and ground (or some other reference potential) and the voltage $V_{MON}$ across the bridge being monitored. In embodiments of the present disclosure a similar resistive bridge element could be used but configured differently, as indicated in the right-hand side of FIG. 2. It will be understood however that other variable resistance components could be used, although the ability to use readily available sensing components is advantageous.

In use, under no applied strain, the resistive component 105 may have a default resistance value, say $R_0$. Under an applied strain the resistance of resistive component 105 may vary, e.g. to $R_0+\Delta R$. This change in resistance will change the time constant of the filter 103 and will thus result in a change in frequency of the oscillation signal $S_{OSC}$. This change in frequency will happen rapidly, as the rate of charging and discharging of capacitance 106, which defines the value of feedback signal $S_{FB}$ and thus the period of each output state of comparator 102 in each cycle, will depend on the then-current value of resistance of resistive component 105. The oscillator 101 of FIG. 1 can thus be seen as a resistance-to-frequency converter—or as in this example the value of resistance depends on applied strain—a strain-to-frequency converter.

The oscillation signal $S_{OSC}$ can thus be seen as encoding the value of resistance of the resistive component 105 by the frequency $F_{OSC}$ of the oscillation signal.

A decoder 107 is arranged to receive the oscillation signal $S_{OSC}$ and, in this case, determine an indication of strain applied to the resistive component 105. In some embodiments the decoder 107 may be configured to determine whether the frequency of the oscillation signal $S_{OSC}$ has crossed one or more defined thresholds indicating that a sufficient strain has been applied to the resistive component 105 to correspond to a button push. In some embodiments the decoder may simply determine whether or not a sufficient strain has been applied, i.e. to determine whether or not a button push is detected. In some embodiments however the decoder may determine various levels of applied strain, e.g. to distinguish between a hard push or a soft push as in some use cases the device may be configured to take different action depending on the strength of a user push.

There are various ways in which a decoder 107 could be implemented in order to determine whether the frequency of the oscillation signal $S_{OSC}$ is above one or more thresholds.

In some embodiments the decoder 107 may comprise a counter 108 to produce a count value based on the frequency of the oscillation signal. To produce the count value the counter 108 may also receive a counter clock signal CLK.

In some embodiments the counter clock signal CLK may be configured to define a frame period at a frequency which is lower than the expected operating frequency range of the oscillator 101, such that a plurality of cycles of the oscillation signal would be expected within each frame period. In such a case the counter 108 may be configured to count the number of cycles of the oscillation signal $S_{OSC}$, e.g. the number of pulses of the high output state, within the frame period. As the frequency of the oscillation signal $S_{OSC}$ changes, the count value for each frame period will also change, e.g. the count value will increase if the frequency of the oscillation signal increases. The frame period can be selected to provide a sufficient update rate for button push detection. The frame period may also be selected so as to have a duration which is less than the timescale over which force is typically applied by a user during even a relatively brief button push. This will ensure that during a push event at least some frames will correspond to the force being applied, and hence the changed frequency of the oscillation signal $S_{OSC}$, for substantially most of the frame period. The resulting count value for each frame may be output as a count signal $S_{CT}$ to a controller 109. As mentioned a higher count value would indicate more cycles per frame period and hence a higher frequency of the oscillation signal $S_{OSC}$. The arrangement illustrated in FIG. 1, with the counter 108 arranged to counter the number of cycles of the oscillation signal $S_{OSC}$ in a frame period defined by a relatively slow counter clock signal CLK is suitable for detecting any significant changes in frequency of the oscillation signal $S_{OSC}$ and can be used as a low power sensor for any significant change in a transducer parameter. For example when used as a strain sensor this arrangement would provide a low power sensor suitable for detecting a button press that can be relatively small in size.

In some embodiments however it may be advantageous to provide faster or more accurate and/or more precise sensing of the relevant transducer parameter, e.g. where the transducer parameter varies in an analogue fashion and it may be useful to provide an output that tracks the analogue variation relatively more quickly or more accurately. In some applications therefore the counter clock signal CLK could be at a relatively fast clock frequency, greater than the expected operating range of frequencies of the oscillation signal $S_{OSC}$. In which case the counter 108 could be arranged to count the number of counter clock cycles in a period defined by the oscillation signal $S_{OSC}$, say the cycle period between successive rising (or falling) edges in the oscillation signal $S_{OSC}$. The resulting count value for each cycle, or the average count value over a plurality of cycles, may be output as a count signal $S_{CT}$ to a controller 109. A higher count value would indicate a longer cycle period and hence a lower frequency. The controller 109 could compare the count value to one or more thresholds. This can provide an output signal that tracks the analogue variation in the sensed transducer parameter, but does however require a relatively fast counter clock signal CLK.

For the arrangement illustrated in FIG. 1 operating with a fast counter clock in this way could, in some instances, result in aliasing of unwanted tones into the signal frequency band of interest. To avoid or mitigate the effect of such aliasing, in some embodiments the oscillator 101 may comprise a timing controller for controlling at least one timing parameter of the oscillation signal $S_{OSC}$.

Figure 3:
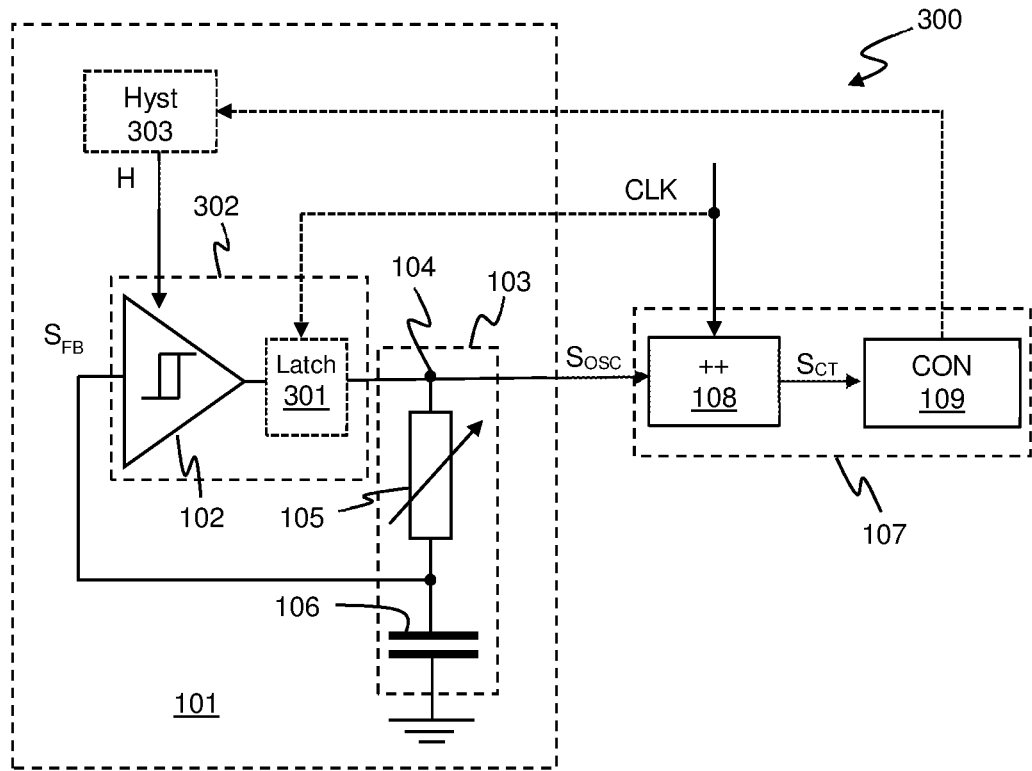
FIG. 3 illustrates a sensing circuit according to another embodiment.

In some embodiments the timing parameter may be the timing of signal transitions in the oscillation signal and the oscillator 101 may be configured to synchronise signal transitions in the oscillation signal to the clock signal CLK provided to the counter 108. FIG. 3 illustrates a sensor 300 according to such an embodiment in which the clock signal CLK is provided to the counter 108 and also to a timing controller 301 which is a latch arrangement configured to provide latching to the output of the hysteretic comparator 102. The hysteretic comparator 102 together with latch arrangement 301 provide a latched hysteretic comparator module 302 which is configured such that the output oscillation signal $S_{OSC}$ only changes state at the next relevant clock edge of the clock signal CLK following the feedback signal $S_{FB}$ reaching the relevant threshold. Note that FIG. 3 illustrates the latch arrangement 301 as a separate component acting on the output of the hysteretic comparator 102 for clarity only, and in some embodiments the hysteretic comparator 102 may itself by a latched hysteretic comparator and thus include the functionality of the latch arrangement.

Constraining the oscillation signal $S_{OSC}$ to change state at a time synchronised to the clock signal CLK may result in the cycle frequency possibly being slightly different from what it might otherwise have been, which can be seen as a quantisation error, but the amount of error is limited to the period of the clock cycle. However synchronising the oscillation signal $S_{OSC}$ to the same clock signal CLK as the counter 108 means that the cycle period of the oscillation signal $S_{OSC}$ will correspond to an integer number of clock cycles, thus meaning that there will be no error associated with the counter 108 and out-of-band tones will not fold down into the signal band of interest.

Additionally or alternatively the timing parameter could, in some embodiments, comprises oscillation frequency limits for the oscillation signal. In the example illustrated in FIG. 3 the timing controller may comprise a hysteretic controller 303 for controlling the amount of hysteresis applied by the hysteretic comparator 102. The hysteretic controller 303 of oscillator 101 may be configured to control the hysteresis applied based on an indication of frequency of the oscillation signal, so as to maintain the frequency within certain limits. In particular the hysteretic controller 303 may be responsive to the output of the controller 109. As the value of the resistance of resistive component 105 changes, the cycle period and hence the frequency of the oscillation signal $S_{OSC}$ will vary, as discussed above. Constraining the frequency of the oscillation signal $S_{OSC}$ to stay within certain defined limits can reduce the chance of unwanted tones aliasing into the signal band of interest.

In addition, if the cycle period were to change significantly, e.g. to become much longer, this would change the resulting count value for the cycle period, e.g. require the counter to count to a much higher value, and also effectively change the sample period of the count values output from the counter 108. The hysteretic controller 303 of oscillator 101 could therefore be configured to vary the hysteresis applied by the hysteretic comparator 102 to keep the cycle period duration, and hence required count value and/or sample rate, within defined limits which may maintain a more regular sample rate and/or ease requirements for the counter.

Clearly varying the hysteresis value will change the relationship between the resistance of the resistive component 105 and resulting frequency of the oscillation signal, in effect the hysteresis is a gain factor in the strain-to-frequency conversion (or other physical quantity-to-frequency conversion as appropriate). However as the controller 109 itself controls the required hysteresis value, the controller 109 can take the present hysteresis value into account when assessing the count values indicated by the count signal $S_{CT}$, i.e. it can take a relevant gain factor into account when determining the strain.

The hysteretic controller 303 may in some embodiments thus only vary the hysteresis if the frequency of the oscillation signal exceeds some limit, to effectively vary the sensitivity of the sensing circuitry to the applied strain, e.g. for dynamic range or the like. For example the controller 109 could be configured to indicate to the hysteretic controller 303 that the count signal $S_{CT}$ has crossed a threshold, and to increase or decrease the hysteresis by a predefined amount.

Alternatively the controller 109 could monitor a time-average of count values from the count signal $S_{CT}$ against a nominal count value and control the hysteresis applied based on an indication of the difference between the average count value and the nominal count value, with the response of the hysteresis control loop being configured to be much slower than the expected signal variation of interest for the physical property being measured. The frequency of the oscillation signal may thus be stabilised against longer term variations in quiescent frequency of the oscillator, for example due to temperature or similar variations, while still being responsive to shorter term variations in the physical property being measured.

The embodiments discussed above with reference to FIGS. 1 to 3 can thus be used to provide strain sensing in a low power way, in particular to detect applied force or pressure, by detecting a change in resistance. The use of such an oscillator and decoder for strain sensing is a particularly advantageous implementation of the principles of the present disclosure. It should be noted however that the principles of the present disclosure may be applied generally to sensing of any variable resistance, whether due to an applied strain or not, by converting a change in resistance to a detectable change in frequency of an oscillation signal. Resistive sensing embodiments may therefore provide an oscillator comprising a hysteretic comparator and a loop filter, where the time constant of the filter, and hence the frequency of the oscillation signal produced by the oscillator depends on the value of a variable resistance.

The principles of the present invention may further be applied to sensing variations in other electrical properties which it is which to monitor, such as capacitance or inductance for example. In general embodiments relate to sensing circuits having an oscillator including a comparator and a loop filter, where the frequency of oscillation depends, at least partly, on a variable impedance which forms at least part of the loop filter and wherein the impedance of said variable impedance is configured to vary in a predetermined manner as a function of a physical property or quantity that it is desired to measure.

Figure 4:
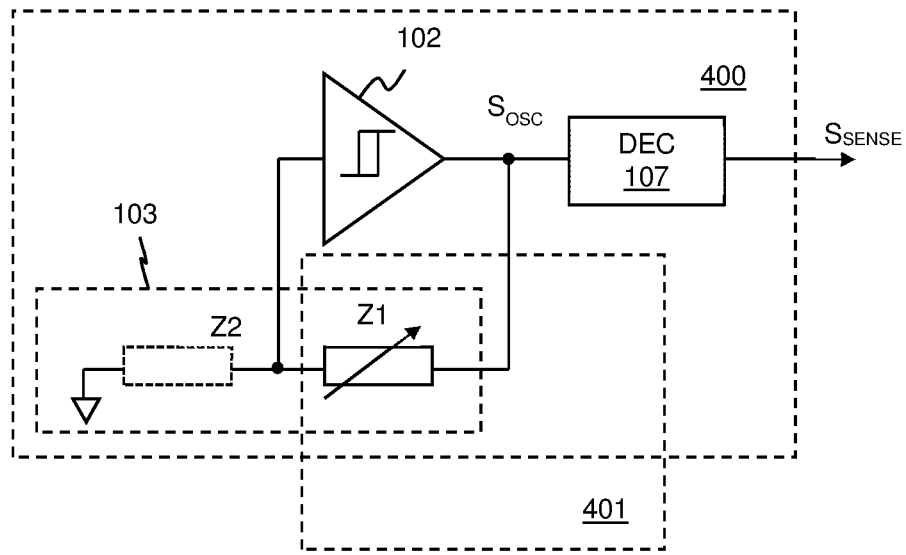
FIG. 4 illustrates generically a sensing circuit according to embodiments.

FIG. 4 illustrates generically embodiments of the invention. FIG. 4 illustrates a sensing circuit 400 for sensing a physical property or quantity of interest that includes an oscillator formed by hysteretic comparator 102 and loop filter 103. The loop filter 103 includes at least a first impedance Z1 which is a variable impedance with an impedance that depends on the physical property or quantity of interest. An oscillation signal $S_{OSC}$ generated by the oscillator is input to a decoder 107 that provide an output sense signal $S_{SENSE}$ indicative of the physical property or quantity of interest.

The variable first impedance Z1 could be variable in terms of any, or all, of resistance, capacitance and/or inductance. The variable first impedance Z1 could comprise a single element with a variable impedance or in some embodiments could comprise a plurality of components together providing variable impedance, which could be a complex variable impedance. In some embodiments the loop filter 103 may also comprise at least a second impedance Z2. The second impedance Z2 may be an impedance that does not substantially vary with the physical property or quantity of interest.

As mentioned the variable first impedance Z1 is arranged to form at least part of the loop filter of the oscillator of the sensing circuit 400. In some embodiments the variable first impedance Z1 may be a dedicated impedance of the sensing circuit 400 in that it is provided purely for the function of the sensing circuit 400. For instance the variable first impedance could comprise a variable resistance such as described above with respect to FIG. 3 which is provided purely as part of a strain transducer. In some embodiments however at least the variable first impedance of the loop filter may be a component of some other system or apparatus 401 which it is wished to monitor. For instance, as will be described in more detail below, in some examples the variable first impedance Z1 could be a capacitance due to a voice coil of a loudspeaker or the like and thus the variable first impedance Z1 also forms part of the loudspeaker 401.

The loop filter may be any type of filter, for instance an RC filter or similar as discussed with reference to FIG. 1 or an integrator as will be discussed below. One or more nodes of the loop filter may be coupled to a defined voltage such as ground or some other reference voltage such as illustrated in FIG. 4, but it should be understood that the positions of Z1 and Z2 illustrated in FIG. 4 could be swapped.

Figure 5:
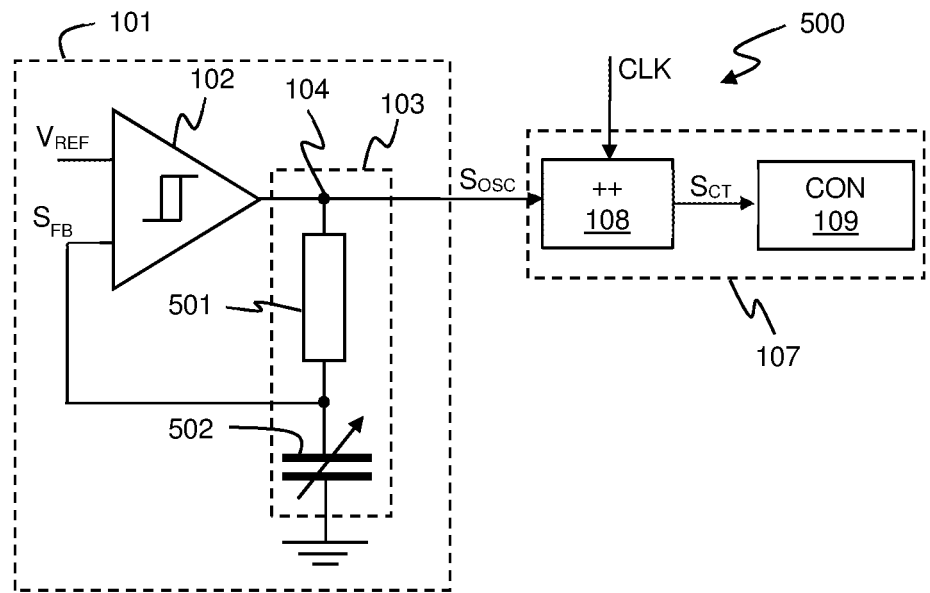
FIG. 5 illustrates an oscillator with a variable capacitance.

FIG. 5 illustrates an example of a sensor arrangement 500 similar to that illustrated in FIG. 1, but where the oscillator 101 comprises a resistance 501 and a capacitance 502, e.g. first and second impedances, and the value of capacitance 502 may vary in use, e.g. due to some physical property or quantity. The capacitance 502 could, for instance, be a capacitance of a component of a device that it is wished to monitor for some reason, say the voice coil of a loudspeaker for instance or a coil of a linear resonant actuator such as may be used as a haptic transducer. The operation of the sensor arrangement 500 is similar to that described above, a variation in the value of capacitance 502 will change the time constant of the filter 103 and thus alter the frequency of the oscillation signal, which can be detected by decoder 107. Such an arrangement could, for example be useful for position sensing of the coil of an acoustic transducer.

Figure 6:
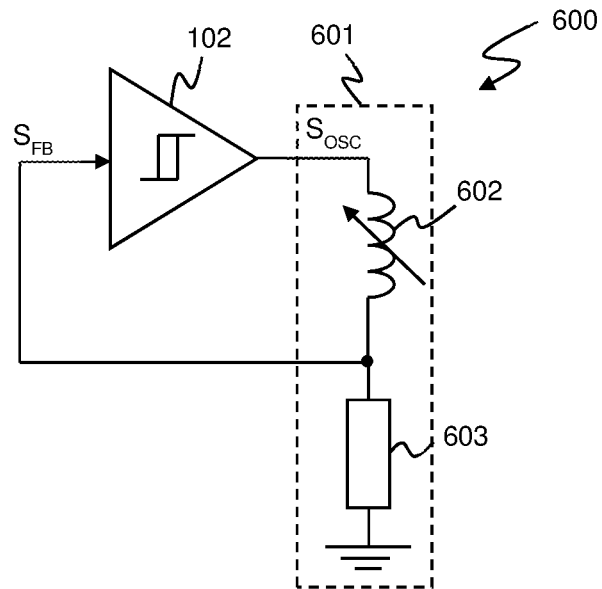
FIG. 6 illustrates another example of an oscillator.

FIG. 6 illustrates an alternative example of an oscillator 600 which has an LR filter 601 comprising an inductance 602 and resistance 603. At least one of the inductance 602 and resistance 602 could be variable in use and a variation in inductance and/or resistance would result in a variation in the time constant of the filter 601 and hence a detectable variation in frequency of the out of the oscillator. The inductance 602 could, for instance, be an inductance of a component of a device that it is wished to monitor for some reason, say the voice coil of a loudspeaker for instance or a coil of a linear resonant actuator such as may be used as a haptic transducer.

In some embodiments the inductance 602 could be associated with a position or movement sensor and may be configured such that an observed impedance of the inductance varies based on relative movement with respect to some component.

Figure 7:
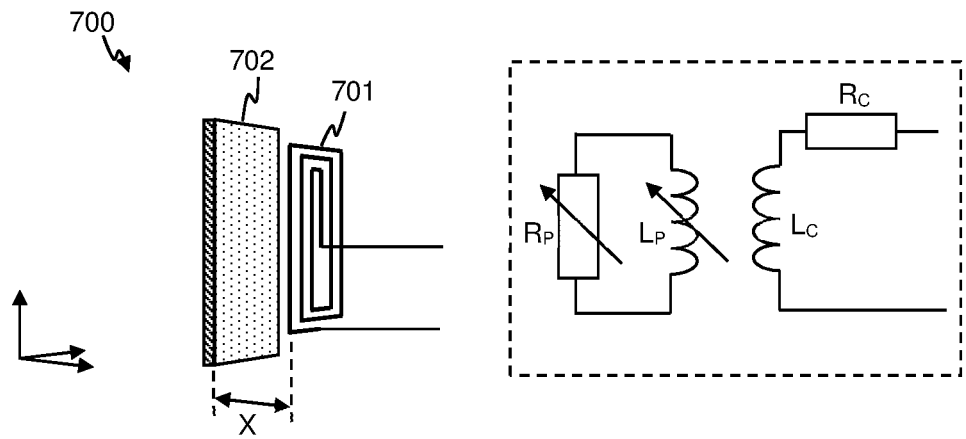
FIG. 7 illustrates a displacement sensor arrangement.

For example FIG. 7 illustrates a displacement sensor arrangement 700 having a conductive coil 701 spaced apart from a conductor plate 702 and configured such that at least part of the conductor plate 702 may be displaced with respect to the coil 701, i.e. such that the relative spacing X between the coil 701 and conductor plate 702 may be variable. The coil 701 is configured with respect to the conductor plate 702 such that a current flowing in the coil 701 can induce eddy currents within the conductor plate 702. In other words, in use there may be a mutual inductive coupling between the coil 701 and the conductor plate 702, which will have some resistance.

The level of inductive coupling, and thus the current induced within the conductor plate 702 and the power this dissipates, will vary with the distance between the coil 701 and the plate 702. This displacement sensor arrangement 700 may be represented by the lumped model illustrated in the dashed box of FIG. 7, where the coil 701 can be modelled by a series connection of inductance $L_C$ and resistance $R_C$, and the conductor plate 702 can be modelled by an inductance $L_P$ and resistance $R_P$, where the inductance $L_P$ and resistance $R_P$ vary with the relative spacing X. This system as a whole will, viewed from the terminals of the coil 701, present a variable inductance and resistance (although the variation in inductance may be expected to dominate), which vary with the relative spacing X between the coil 701 and conductor plate 702.

The coil 701 of the displacement sensor arrangement 700 may thus be used to provide the inductance 602 illustrated in FIG. 6 to provide a sensor in which the frequency of the oscillation signal varies with the separation between the coil 701 and conductor plate 702. Note that in some embodiments there may be an apparent resistance in series or in parallel with the coil, but operation will be qualitatively similar. There may additionally or alternatively also be some parasitic or deliberate capacitance in parallel with the coil, but if configured to oscillate below the frequency of the resulting resonance the effect of the inductance will still dominate the behaviour.

The coil 701 and conductor plate 702 may thus be configured so as to be moveable with respect to one another in response to an applied stimulus so as to provide monitoring for said stimulus. In some embodiments such an arrangement could be provided as part of a force sensor or a button press detector. The coil 701 and conductor plate 702 may thus be arranged so that the relative spacing between the coil 701 and conductor plate 702 varies with force applied to a certain location, such as a control button of a host electronic device.

For example the conductor plate 702, which may for example be a metal plate, may be coupled to, or form part of, a button. The plate 702 could, for instance, comprise a suitably shaped metal button, or a layer formed on or within a button. In some embodiments the conductor plate may be substantially planar, i.e. flat, although in some embodiments at least part of the conductor plate 702 could comprise a surface with some curvature. The coil 701 may conveniently be arranged substantially within one plane and could comprise a suitable conductive pattern or trace, e.g. formed on or within an adjacent printed circuit board. Other arrangements for the coil 701 and conductor plate 702 may be implemented in other embodiments. In use, when the button is pressed the conductor plate 702 is displaced with respect to the coil 701 so as to change the relative spacing, e.g. at least part of the conductor plate 702 of the button may be displaced towards the coil 701 to reduce the spacing X. This will change the oscillation frequency of the oscillator arrangement 600 in a detectable way.

A sensor such as that illustrated in FIG. 1 or FIG. 5 could thus be implemented with the arrangement 600 of FIG. 6 used as the oscillator 101, and the displacement arrangement 700 of FIG. 7 used as inductance 602.

Such a sensor could be arranged as a button press detector. The conductor plate 702 and coil 701 may be located in a defined button area of a device. The controller 109 may thus be responsive to a change in frequency of the oscillation signal $S_{OSC}$ to detect displacement of the conductor plate 702 with respect to the coil 701, i.e. a change in relative spacing arising from a press of the button, above a threshold amount of displacement, i.e. that the conductor plate 702 has moved by more than a defined amount with respect to the coil 701 (which may be a relative movement towards the coil 701 so as to reduce the relative spacing X). The controller 109 may compare the oscillation frequency versus a threshold frequency to detect a button displacement indicative of a button press. In some examples the controller 109 may compare the oscillation frequency relative to a nominal value that corresponds to the expected frequency for the quiescent value of spacing between the conductor plate 702 and the coil 701. The controller 109 may determine when the oscillation frequency is indicative of the button having been pressed and may generate a control signal indicative that the button has been pressed. This may be a simple binary signal indicative that a button press has occurred, but in some examples the change in oscillation frequency may be analysed to determine some additional information, e.g. to distinguish between and hard press or a soft press or provide an indication of the duration of the press. The sensor may comprise a hysteresis control loop, as discussed above, where the hysteresis control loop has a response time slower than an anticipated button actuation time, in order to stabilise the response versus longer-term variations in the quiescent frequency of the oscillator.

Movement of the button in response to a user stimulus will change the impedance and hence change the oscillator output frequency. Such a button need not have mechanical contacts or separate moving parts. Only part of the plate needs to be able to be displaced by a relatively small amount. Such a button need not be attached to a strain-sensing resistance, thus avoiding the need for an extra resistance component and the mechanical connection thereto. The conductive plate 702 may be a metal surface having a desired shape for the button and embedded in an adequately flexible part of the body of a host device so as spaced away from a sense coil which may for example be arranged in an underlying printed circuit board.

Other types of filter arrangement using inductances, resistances and/or capacitances could be implemented in some applications.

Figure 8:
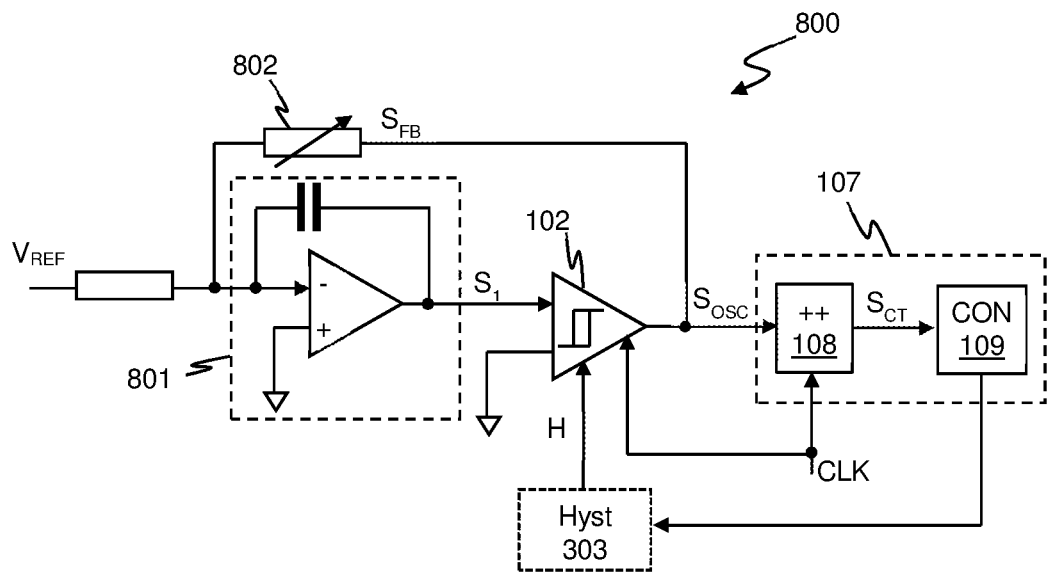
FIG. 8 illustrates an example of an oscillator with an integrator as the loop filter.

In some embodiments the loop filter could be arranged as an integrator, as illustrated in FIG. 8. FIG. 8 illustrates a sensor arrangement 800 in which the output oscillation signal $S_{OSC}$ is fed back and combined with the voltage reference $V_{REF}$ before being input into an integrator 801, although the voltage reference $V_{REF}$ may be omitted in some implementations. A first signal $S_1$ output from the integrator is input to the hysteretic comparator 102 which provides an oscillation signal $S_{OSC}$ to the decoder 107 in a similar fashion as discussed above. At least one component of the filter arrangement, such as the feedback resistor 802 may be variable, e.g. based on an environmental parameter such as applied strain, to provide a variable time constant and hence a variable frequency of the oscillation signal $S_{OSC}$.

As the embodiment of FIG. 8 has a loop filter comprising the integrator 801 the sensor provides noise shaping of the output signal as will be understood by one skilled in the art. The arrangement illustrated in FIG. 8 may also benefit from controlling at least one timing parameter of the oscillation signal in a similar manner as discussed above in relation to FIG. 3. Thus the oscillation signal $S_{OSC}$ may be synchronised to the counter clock signal; CLK provided to the counter 108 of decoder 108 in a similar manner as discussed above. In the example illustrated in FIG. 8 the hysteretic comparator 102 may be a latched hysteretic comparator, although in some embodiments a separate latch arrangement could be provided to latch the output of the hysteretic comparator 102. Additionally or alternatively a hysteretic controller 303 could be configured to control a hysteresis applied by the hysteretic comparator 102 in a similar fashion as discussed above in relation to FIG. 3.

In general therefore embodiments of the disclosure relate to sensing circuitry, for example for sensing a physical property or quantity of interest, e.g. an environmental parameter, comprising an oscillator for generating an oscillation signal, where the oscillator comprises a hysteretic comparator and a loop filter, wherein an electrical property of the loop filter is variable with the physical property or quantity of interest so as to vary a time constant associated with the filter and hence the oscillation frequency of the oscillation signal. A decoder receives the oscillation signal provides an indication of any change in frequency and hence any change in the physical property or quantity of interest.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

At least some embodiments may be implemented in a host device, especially a portable and/or battery powered host device. Some embodiments may be implemented in an electronic device which may comprise at least one of: a communication device, a mobile or cellular telephone, a smartphone; a computing device; a laptop, notebook or tablet computing device; a media player; a games device; a wearable device; a smartwatch; a voice controlled device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A sensing circuit for monitoring a physical property or quantity of interest comprising:
an oscillator comprising a hysteretic comparator and a loop filter configured to output an oscillation signal; wherein the loop filter comprises a first component with an electrical property that varies with said physical property or quantity; wherein a time constant of the loop filter depends on the electrical property of the first component; and
a decoder configured to receive the oscillation signal and provide an indication of any change in frequency of the oscillation signal.

2. A sensing circuit as claimed in claim 1 wherein the oscillator comprises a timing controller for controlling at least one timing parameter of the oscillation signal.

3. A sensing circuit as claimed in claim 2 wherein said at least one timing parameter of the oscillation signal comprises a timing of any transitions in the oscillation signal and wherein the timing controller is configured to receive a first clock signal which is also used for controlling timing of the decoder and to synchronise said transitions in the oscillation signal to the first clock signal.

4. A sensing circuit as claimed in claim 2 wherein said at least one timing parameter of the oscillation signal comprises oscillation frequency limits for the oscillation signal.

5. A sensing circuit as claimed in claim 4 wherein the timing controller comprises a hysteresis controller for controlling a hysteresis applied by the hysteretic comparator based on an output of the decoder to maintain the frequency of the oscillation signal within defined limits.

6. A sensing circuit as claimed in claim 1 wherein the decoder comprises a counter configured to receive a counter clock signal and to produce a count value of either:
a number of clock cycles of the counter clock signal in each of a plurality of periods defined by the oscillation signal; or
a number of cycles of the oscillation signal in each of a plurality of frame periods defined by the clock signal.

7. A sensing circuit as claimed in claim 3, wherein the decoder comprises a counter configured to receive a counter clock signal and to produce a count value of a number of clock cycles of the counter clock signal in each of a plurality of periods defined by the oscillation signal and wherein said first clock signal is used as the counter clock signal.

8. A sensing circuit as claimed in claim 6 further comprising a controller configured to receive a count signal from the counter indicative of the count values wherein the controller is configured to determine a value for said physical property or quantity based on the count signal.

9. A sensing circuit as claimed in claim 1 wherein said at least one electrical property of the loop filter which is configured to vary comprises an impedance of a variable impedance.

10. A sensing circuit as claimed in claim 1 wherein said at least one electrical property of the loop filter which is configured to vary comprises a resistance of a variable resistive component.

11. A sensing circuit as claimed in claim 10 wherein said physical property or quantity of interest is an applied strain and the resistance of the variable resistive component is configured to vary with applied strain to the variable resistive component.

12. A sensing circuit as claimed in claim 11 wherein the sensing circuit is configured as a button press detector, wherein the sensing circuit comprises a controller responsive to the indication of any change in frequency of the oscillation signal to detect an applied strain above a threshold level being applied to a defined button area of a device.

13. A sensing circuit as claimed in claim 1 wherein said at least one electrical property of the loop filter which is configured to vary comprises a capacitance of a variable capacitive component.

14. A sensing circuit as claimed in claim 13 wherein said physical property or quantity of interest comprises position of a coil of an acoustic transducer and the capacitance of the variable capacitive component is configured to vary with position of the coil.

15. A sensing circuit as claimed in claim 1 wherein said at least one electrical property of the loop filter which is configured to vary comprises an inductance of a variable inductive component.

16. A sensing circuit as claimed in claim 15 wherein the variable inductive component comprises a conductive coil configured with respect to a conductive plate such that at least part of the conductor plate may be displaced with respect to the conductive coil so as to vary an observed impedance of the variable inductive component.

17. A sensing circuit as claimed in claim 16 wherein the sensing circuit is configured as a button press detector, wherein the conductor plate and coil are located in a defined button area of a device and the sensing circuit comprises a controller responsive to the indication of any change in frequency of the oscillation signal to detect a displacement of the conductor plate with respect to the conductive coil above a threshold level.

18. A transducer apparatus comprising a transducer and a sensing circuit as claimed in claim 1 for monitoring a transducer parameter of said transducer.

19. A sensing circuit comprising:
an oscillator comprising a hysteretic comparator and a loop filter configured to output an oscillation signal; wherein the loop filter comprises a first component with an impedance that varies in response to an external stimulus, wherein a time constant of the loop filter depends on the electrical property of the first component; and
a decoder configured to receive the oscillation signal and provide an indication of frequency of the oscillation signal.

20. A sensor for sensing a physical property or quantity of interest comprising:
- an oscillator comprising a comparator and a loop filter configured to output an oscillation signal;
- wherein the loop filter comprises a first component with an electrical property that varies with said physical property or quantity of interest, wherein a time constant of the loop filter depends on the electrical property of the first component; and
- a decoder configured to receive the oscillation signal and a first clock signal and provide a count value as an indication of a frequency of the oscillation signal;
- wherein the oscillator comprises a timing controller for controlling at least one timing parameter of the oscillation signal based on the first clock signal and/or the indication of the frequency of the oscillation signal.

* * * * *